(12) United States Patent
Kim

(10) Patent No.: US 6,559,475 B1
(45) Date of Patent: May 6, 2003

(54) TEST PATTERN FOR EVALUATING A PROCESS OF SILICIDE FILM FORMATION

(75) Inventor: Jong-Chae Kim, Seoul (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 97 days.

(21) Appl. No.: 09/704,760

(22) Filed: Nov. 3, 2000

(30) Foreign Application Priority Data

May 25, 2000 (KR) .......................... 2000-28342

(51) Int. Cl.[7] .................. H01L 23/58; G01R 27/08; G01R 31/26; G01R 27/26

(52) U.S. Cl. .................. 257/48; 324/716; 324/765; 324/766; 324/671; 355/133; 438/18

(58) Field of Search ............................ 257/48; 324/765, 324/766, 671, 716; 355/133; 438/18

(56) References Cited

U.S. PATENT DOCUMENTS 4,437,760 A * 3/1984 Ausschnitt .................. 355/133

* cited by examiner

Primary Examiner—Steven Loke
(74) Attorney, Agent, or Firm—Fleshner & Kim, LLP

(57) ABSTRACT

The present invention relates to a semiconductor device, and more particularly, to a test pattern for evaluating a process of silicide film formation. The test pattern in accordance with the present invention includes: a silicon substrate having an active region and a field region; a first pattern composed of a cross resistor pattern of a polycide layer formed on the field region; and a second pattern composed of polycide layer and a silicide layer formed on the active region. The second pattern includes: a pair of polycide patterns composed of a first polycide strip and a second polycide strip extended in parallel, being spaced from each other a predetermined interval on an insulating film formed on the active region; and an active silicide strip formed between the first polycide strip and the second polycide strip.

16 Claims, 2 Drawing Sheets

TEST PATTERN FOR EVALUATING A PROCESS OF SILICIDE FILM FORMATION

BACKGROUND OF THE INVENTION

1. Field of the Invention

The present invention relates to a semiconductor device, and more particularly, to a test pattern for evaluating a process of silicide film formation.

2. Description of the Background Art

Generally, a logic circuit must be operated at a high speed. To satisfy this high speed characteristic, silicide or polycide is used as a wiring material for a semiconductor device. For example, polycide (structure in which a silicide layer is stacked on the a polysilicon layer) wiring can be employed to a gate electrode of a transistor constructing the logic circuit, and a silicide layer can be formed on the top surface of a source/drain. Therefore, the inventor of the present invention became interested in a test pattern for evaluating a process of silicide or polycide film formation and a method thereof. Although many conventional methods for evaluating a process of metal or polysilicon wire formation are known, any techniques for evaluating a process of silicide film formation are not known.

Next, a conventional test pattern for evaluating a process of conductive wire formation and a method thereof will be described.

Firstly, FIG. 1 illustrates a van der Pauw cross resistor pattern well-known as a test pattern for measuring the sheet resistance Rsh. The van der Pauw cross resistor pattern for measuring the sheet resistance is disclosed by Buehler, M. G., Grant, S. D., and Thurber, W. R., "Bridge and van der Pauw Sheet Resistors for Characterizing the Line Width of Conducting Layers," in J. Electrochem. Soc., Vol. 125, No. 4 (April 1978), which is used by a number of semiconductor manufacturers in order to evaluate the characteristics of a conductive line. As illustrated therein, a cross resistor pattern 100 is constructed from two rectangular conductive layers that intersect at right angles. The rectangular conductive layers 110 and 120 each have a width (a), and a length(b) about twice the width. The portion at which a first conductive layer 110 extended in a longitudinal direction and a second conductive layer 120 extended in a horizontal direction perpendicular to the first conductive layer 110 intersect is a central portion 130, and the sheet resistance is the resistance of the central portion 130 whose horizontal and longitudinal sides have the same length (a). One end of the first and second conductive layers 110 and 120 is connected to current contact pads I1 and I2 by conductive taps 110a and 120a, respectively. In addition, the other end of the first and second conductive layers 110 and 120 is connected to voltage contact pads V1 and V2 by the conductive taps 110b and 120b, respectively.

In the cross resistor pattern of FIG. 1, the sheet resistance Rsh can be obtained by measuring the voltage variance between the voltage contact pads V1 and V2, after applying an already known current through current contact pads I1 and I2.

FIG. 2 illustrates a bridge resistor pattern. The bridge resistor pattern 200, having a conductive strip 210 and square current contact pads Ia and Ib each connected to both ends of the conductive strip 210, is formed in a dog bone shape. In addition, voltage contact pads Va and Vb are electrically connected to the lateral ends of the conductive strip 210 through conductive taps 220a and 220b.

The width (W) of the conductive strip 210 is preferably the same as the length (a) of the horizontal and longitudinal sides of the central portion of the sheet resistor test pattern 100 of FIG. 1. In addition, the length of the conductive strip 210 can be varied. The resistance Rdb of the conductive strip 210 can be calculated by measuring the voltage difference between the voltage contact pads Va and Vb while applying a known current through the current contact pads Ia and Ib. The above-mentioned resistance is a resistance corresponding to the length (L) between the two voltage contact pads Va and Vb.

By forming a plurality of test patterns of different lengths (L), the reliability of evaluating a process of conductive film formation is increased. In addition, the width (W) of the conductive strip also can be varied, and the reliability of the evaluation is increased by manufacturing a plurality of test patterns of different lengths or widths.

The method for evaluating a process of conductive film formation using test patterns of FIGS. 1 and 2 is as follows. First of all, the sheet resistance Rsh is obtained from the cross resistor pattern shown in FIG. 1 using the van der Pauw equation.

In addition, the resistance Rdb of the conductive strip 210 is obtained by applying a current through the conductive strip 210. Then, the actual length and width (Weff, Leff) of the pattern of FIG. 2 implemented on the semicondcutor substrate is measured.

Next, the sheet count (sc) i.e., the value obtained by dividing the length Leff by width Weff of the conductive strip is calculated, and then the whole resistance Rdb is divided by the sheet count (sc), thereby obtaining the sheet resistance Rsh' in a strip-type pattern such as FIG. 2.

Then, in a case where the sheet resistances Rsh and Rsh' are identical or similar to one another in comparison, it is assumed that the process is properly performed. In a case the process was properly performed on a wafer, subsequent processes for fabricating semiconductor devices follow on the wafer. However, in a case where the difference between the sheet resistances Rsh and Rsh' deviates from an allowable value, the reilaibility of the device is reduced. Thus, the wafer is disposed of without performing subsquent processes.

However, the conventional method for evaluating a process of silicide film formation using test patterns has the following problems.

In a case where the width of a silicide pattern desired to be tested is the critical dimension or less, the difference between the dimension of the pattern on the photo mask and the dimension of the test pattern actually implemented on the semiconductor substrate is large due to exposure effect in a photolithography process. Consequently, the dimension of a manufactured test pattern needs to be measured, whereby it takes a long time to perform a test, and the test is made complicated.

In addition, on a conductive pattern having a smaller width than the critical dimension, a silicide film is not formed properly. Even if it is formed, when its phase is transited to a low resistance silicide by annealing, the phase transition is not properly made. Thus, the resistance is much higher than that of a silicide of a larger width, the thermal stability is low, and the uniformity is reduced. Therefore, in case of a silicide pattern having a smaller width than the critical dimension, the correlation between the line width and the resistance is irregular, and, accordingly it is difficult to evaluate the process of silicide film formation by an electric measuring method. Due to this, the line width of the pattern is measured by handwork, so it takes a long time to evaluate the process, and the reliability of the evaluation is reduced.

SUMMARY OF THE INVENTION

Accordingly, it is an object of the present invention to provide a test pattern for evaluating a process of silicide film formation in which the evaluation time is shortened, and the reliability of the evaluation is increased, by rapidly measuring the thickness of a silicide film having a line width smaller than the critical dimension by an electric method.

To achieve the above objects, there is provided a test pattern in accordance with the present invention which includes: a silicon substrate having an active region and a field region; a first pattern composed of a cross resistor pattern of a polycide layer formed on the field region; and a second pattern composed of polycide layer and a silicide layer formed on the active region. The first pattern includes: two polycide layer patterns having the same width formed to be orthogonal to each other; a first current contact pad and a first voltage contact pad each connectively formed at the lateral ends of one of the polycide layer patterns; and a second current contact pad and a second voltage contact pad each connectivley formed at the lateral ends of the other polycide layer pattern. The second pattern includes: a pair of polycide patterns composed of a first polycide strip and a second polycide strip extended in parallel, being spaced from each other a predetermined interval on an insulating film formed on the active region, third and fourth current contact pads each connected to the lateral ends of the first polycide strip; third and fourth voltage contact pads connectively formed on the first polycide strip between the third and fourth current contact pads; fifth and sixth current contact pads each connectively formed at the lateral ends of the second polycide strip; fifth and sixth voltage contact pads connectively formed at the second polycide strip between the fifth current contact pad and the sixth current contact pad; an active silicide strip formed between the first polycide strip and the second polycide strip; and seventh and eighth current contact pads each connectively formed at the lateral ends of the active silicide strip.

To further achieve the above objects in a whole or in part, a test pattern according to the present invention is provided that includes a first polycide strip and a second polycide strip extending along a first direction separated by a prescribed distance on an insulating film, first contact pads coupled to both lateral ends of the first and second polycide strips, a silicide strip between the first polycide strip and the second polycide strip, and second contact pads coupled to lateral ends of the silicide strip.

Additional advantages, objects and features of the invention will become more apparent from the description which follows.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

Figure 1:
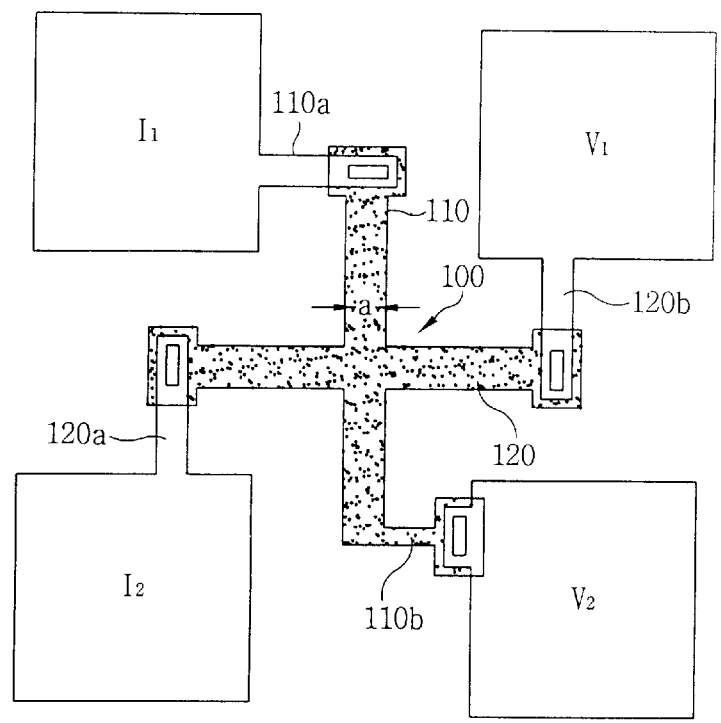
FIG. 1 is one example of a conventional test pattern.
Figure 2:
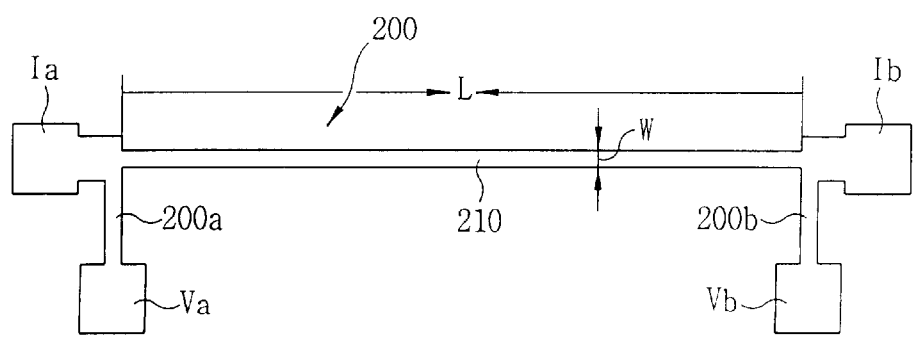
FIG. 2 is another example of the conventional test pattern.
Figure 3:
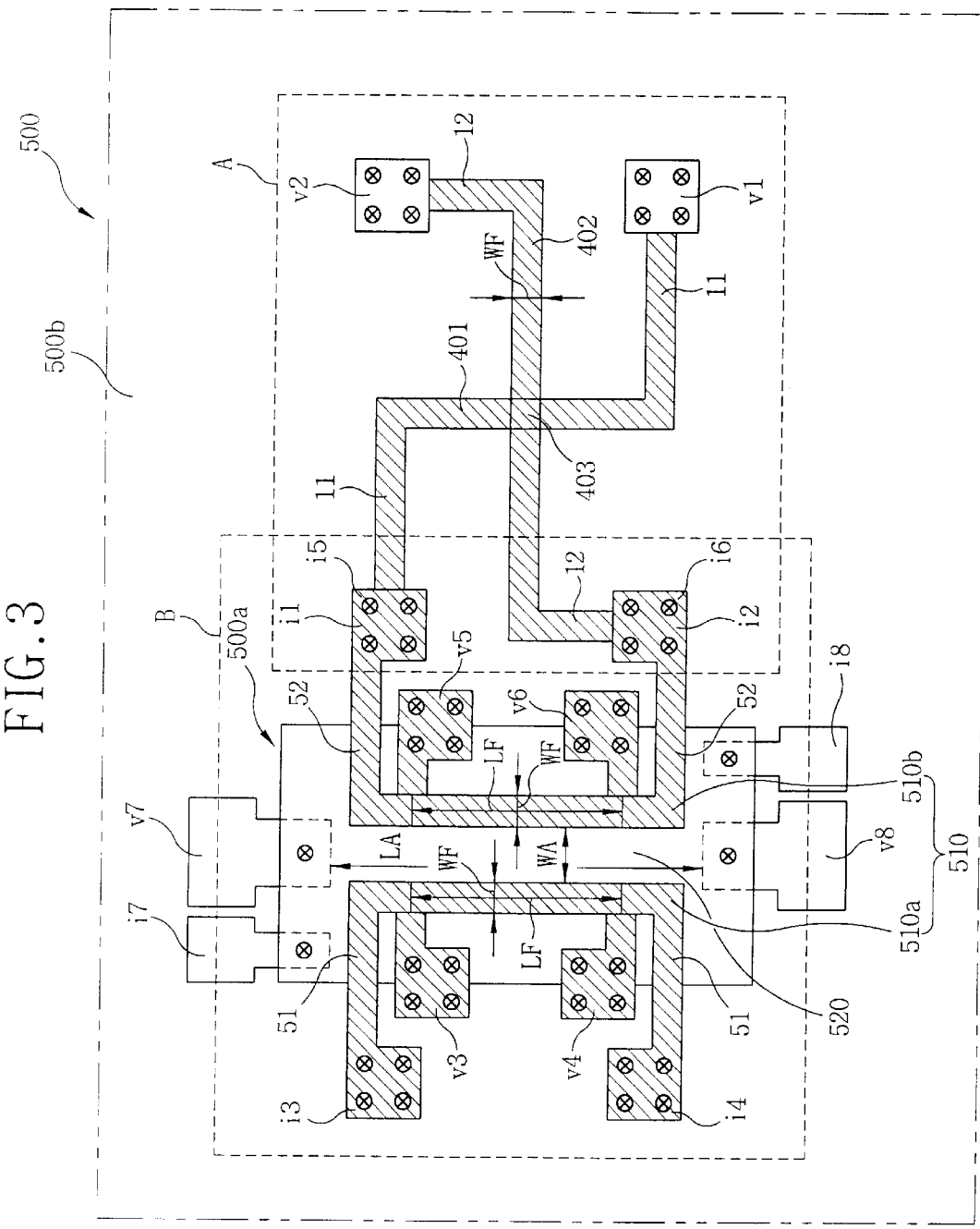
FIG. 3 illustrates a test pattern in accordance with the present invention.

A test pattern for evaluating a process of silicide film formation in accordance with the present invention will now be described with reference to FIG. 3.

A silicon substrate 500 divided into an active region 500a and a field region 500b is prepared, and a test pattern composed of a first pattern A and a second pattern B is formed on the silicon substrate 500.

Firstly, the first pattern A is a conventionally well-known cross resistor pattern formed on the field region 500b, which is used to measure the sheet resistance of a polycide layer in the present invention. The cross resistor pattern A is composed of a first conductive wire 401 extended in a longitudinal direction and a second conductive wire 402 extended in a direction orthogonal to the first conductive wire 401, wherein the sheet resistance is obtained by measuring the resistance of an intersecting portion 403 of the first conductive wire 401 and the second conductive wire 402. The first conductive wire 401 and the second conductive wire 402 are formed to have the same width WF. In addition, the widths WF of the first and second conductive wires 401 and 402 of the first pattern are identical to those of the first and second polycide strips 510a and 510b of the second pattern B.

A first current contact pad i1 is connected to one end of the first conductive wire 401 through a conductive arm 11, and a first voltage contact pad v1 is connected to the other end thereof through the conductive arm 11. In addition, a second current contact pad i2 is connected to one end of the second conductive wire 402 through a conductive arm 12, and a second voltage contact pad v2 is connected to the other end thereof through the conductive arm 12.

After applying a current of a known value through the first current contact pad i1 and the second current contact pad i2, the sheet resistance Rsh can be obtained by measuring the voltages of the first voltage contact pad v1 and the second voltage contact pad v2. The method of measuring the sheet resistance using the cross resistor pattern is a conventionally well-known technique, so the description thereof is omitted.

Next, the second pattern B includes an active region 500a of a predeterrmined size, a pair of polycide strips 510 extended in parallel at a predetermined interval on the top surface of the active region, and an active silicide strip 520 formed between the two polycide strips. The polycide strip 510 is formed by intervening an insulating film on the active region.

One of the pair of polycide strips is referred to as a first polycide strip 510a, and the other one is referred to as a second polycide strip 510b.

The widths of the first and second polycide strips 510 each are denoted by WF.

Third and fourth current contact pads i3 and i4 are connected at the lateral ends of the first polycide strip 510a through a conductive arm 51. In addition, fifth and sixth current contact pads i5 and i6 are connected to the lateral ends of the second polycide strip 510b through a conductive arm 52.

In addition, a third voltage contact pad v3 and a fourth voltage contact pad v4 are connectively formed at the first polycide strip 510a between the third and fourth current contact pads i3 and i4. The length of the first polycide strip 510a between the third voltage contact pad v3 and the fourth voltage current pad v4 is denoted by LF.

In addition, fifth and sixth voltage current pads v5 and v6 are connectively formed adjacent to the fifth current pad i5 and the sixth current contact pad i6, respectively. The length of the second polycide strip 510b between the fifth voltage contact pad v5 and the sixth voltage contact pad v6 is denoted by LF.

The first current contact pad i1 of the first pattern A and the fifth current contact pad i5 of the second pattern B can be shared with each other by using the same pad. In addition, the second current contact pad i2 of the first pattern A and the sixth current contact pad i6 of the second pattern B can be shared with each other by using the same pad.

In addition, a seventh current contact pad i7 and an eighth current contact pad i8 are connected to the ends of the active silicide strip 520 formed between the first polycide pattern 510a and the second polycide pattern 510b. In addition, a seventh voltage contact pad v7 and an eighth voltage contact pad v8 each are formed to be connected to the end portion of the active silicide strip 520. The length of the active silicide strip between the seventh voltage contact pad v7 and the eighth voltage contact pad v8 is denoted by LA. In addition, the spacing between the first polycide strip 510a and the second polycide strip 510b, that is, the width of the active silicide strip 520 is denoted by WA. At this time, WA is the designed dimension specified on the mask, and WA' is the actual width of the active silicide strip when the test pattern is actually manufactured on the semiconductor substrate, so there is a difference (error) between WA and WA' in general.

This is because the exposure effect and the accuracy of etching vary according to the width of the pattern in the photolithography process when the pattern is formed on the semiconductor substrate. In particular, in a case where WA is near the critical dimension or less, the difference is large. Thus, in case of silicide pattern having a width of the critical dimension or less in the conventional art, it is necessary to evaluate the manufacturing process of a semiconductor device by measuring the actual width of the pattern by handwork, after manufacturing the pattern on the semiconductor substrate. Therefore, there is a disadvantage that it takes a long time to evaluate the process.

However, in the present invention, the actual line widths of the first and second polycide strips are obtained by electrically measuring the widths of the first and second polycide strips. Then, the width of the active silicide strip formed between the first and second polycide strips can be estimated by calculating the difference between the actual line width of the first and second polycide strips and the design line width thereof. Thus, it is unnecessary to measure the line width of the active silicide strip by handwork, so the time taken for evaluating the process of silicide film formation is shortened.

The method for evaluating a process of silicide film formation using the test pattern of the present invention is as follows.

Firstly, the sheet resistance Rs of a polycide film is measured by using a cross resistor pattern, which is the first pattern A. The method for measuring the sheet resistance Rs using the cross resistor and the van der Pauw equation is conventionally well-known, so the description thereof is omitted.

Next, after delivering a current Ii through the third current contact pad i3 and fourth current contact pad i4 of the second pattern B, the resistance R of the first polycide strip 510a is calculated by means of mathematical expression 1 by measuring the voltage difference Vd1 between the third voltage contact pad v3 and the fourth voltage contact pad v4.

$$R = \frac{Vd1}{Ii} \qquad (1)$$

Next, the actual line width of the first polycide strip 510a is calculated by means of mathematical expression 2.

$$R = Rs\frac{LF'}{WF'} \qquad (2)$$

wherein, Rs is the sheet resistance of the polycide film obtained from the first pattern A, LF' is the actual length of the first polycide strip 510a (not the dimension specified on the mask but the dimension fabricated on an actual wafer), and WF' is the actual width of the first polycide strip 510a. Here, the length of the first polycide strip 501a, LF', corresponds to the length specified on the mask, LF. This is because there is no possibility of occurring the difference due to the exposure effect since the length is much larger than the critical dimension. Therefore, WF' is an already known value which does not need to be actually measured. However, the width WF' of the first polycide strip 510a is generally different from the width WF specified on the mask. This is because the line width is small so that it is easily changed in the photolithography process and the silicide formation process. Thus, WF' is the value obtained by subtracting the change in width, $2DW_L$, from the width value specified on the mask, WF. Here, the reason why the change in width is referred to as $2DW_L$ is that the width of the first polysilicon strip 510a is varied on both sides, right and left. Therefore, the change in width on one side of the right and left sides is DWL, so the change in width on both sides becomes $2DW_L$. Subsequently, $2DW_L$ can be obtained by means of mathematical expression 3.

$$R = Rs\frac{LF'}{WF - 2DW_L} \qquad (3)$$

wherein, R is the resistance measured from the first polycide strip 510a, Rs is the sheet resistance measured from the first pattern, LF' is the length specified on the mask which is the same as an already known value, LF, and WF is also the width of the first polycide strip on the mask which is an already known value. Therefore, $2DW_L$ and $DW_L$ can be calculated by substituting the above known values for mathematical expression 2.

As described above, $2DW_L$ of the first polycide strip 510a is obtained, and the change in width of the second polycide strip 510b, $2DW_R$ is obtained in the same way, respectively.

Next, the actual width WA' of the active strip 530 formed on the semiconductor substrate can be obtained by mathematical expression 4.

$$WA1' = WA1 - DW_L - DW_R \qquad (4)$$

That is, the present invention has an advantage in that the line width can be electrically measured in a short time by using the test pattern of the present invention even though the width of the active silicide strip is less than the critical dimension.

In addition, after delivering a current Ij through the seventh current contact pad i7 and the eighth current contact pad i8 and measuring the voltage difference Vd2 between the seventh voltage contact pad v7 and the eighth voltage contact pad v8, the resistance Ra of the active silicide strip is obtained by mathematical expression 5.

$$Ra = \frac{Vd2}{Ij} \quad (5)$$

Accordingly, the process of silicide film formation can be evaluated by measuring the line width and resistance of the active silicide strip and comparing them with the expected values thereof.

In the present invention, also in case of silicide pattern having a width smaller than the critical dimension, the width can be calculated by an electrical method, thereby shortening the evaluation time and improving the reliability of the evaluation.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A test pattern, comprising:
    a first polycide strip and a second polycide strip extending along a first direction separated by a prescribed distance on an insulating film;
    first contact pads coupled to both lateral ends of each of the first and second polycide strips;
    a silicide strip between respective interior lateral sides of the first polycide strip and the second polycide strip; and
    second contact pads coupled to lateral ends of the silicide strip, wherein the first and second contact pads each comprise current contact pads and voltage contact pads, respectively.

2. The test pattern of claim 1, wherein the first and second polycide strips are separate and independent from one another.

3. The test pattern of claim 1, wherein the polycide and silicide strips comprise a first pattern formed over an active region of a semiconductor substrate, wherein the test pattern further comprises a second pattern formed over a field region that determines a sheet resistance of the polycide strips.

4. The test pattern of claim 3, wherein the test pattern is a pattern capable of determining one of a manufactured width of the silicide strip and a manufactured resistance of the silicide strip by electrically measuring current and voltage using the first and second contact pads.

5. The test pattern of claim 1, wherein the test pattern is a pattern that determines one of a manufactured width of the silicide strip and a manufactured resistance of the silicide strip by automatically measuring current and voltage using the first and second contact pads.

6. The test pattern of claim 1, further comprising two third contact pads located between the first contact pads coupled to both lateral ends of the first or second polycide strip.

7. The test pattern of claim 6, wherein the third contact pads comprise voltage contact pads.

8. The test pattern of claim 1, further comprising two third contact pads coupled to either the first or the second polycide strip.

9. A test pattern, comprising:
    a silicon substrate having an active region and a field region;
    a first pattern that determines a sheet resistance of a polycide layer on the field region; and
    a second pattern including polycide layer patterns and a silicide layer formed over the active region, wherein the second pattern comprises,
        a pair of polycide layer patterns composed of a first polycide strip and a second polycide strip extended in parallel, being spaced from each other a predetermined interval on an insulating film formed on the active region,
        first and second current contact pads each coupled to lateral ends of the first polycide strip,
        first and second voltage contact pads coupled to the first polycide strip between the first and second current contact pads,
        third and fourth current contact pads each coupled to lateral ends of the second polycide strip,
        third and fourth voltage contact pads coupled to the second polycide strip between the third current contact pad and the fourth current contact pad, and
        an active silicide strip having prescribed dimensions between the first polycide strip and the second polycide strip.

10. The test pattern of claim 9, further comprising:
    fifth and sixth current contact pads respectively coupled to first and second ends of the active silicide strip; and
    fifth and sixth voltage contact pads respectively coupled to the second and first ends of the active silicide strip.

11. The test pattern of claim 10, wherein the second pattern determines a line width of the active silicide strip by measuring line widths of the first polycide strip and the second polycide strip using the current and voltage contact pads.

12. The test pattern of claim 11, wherein the first pattern is a cross resistor pattern.

13. A test pattern, comprising:
    a silicon substrate having an active region and a field region;
    a first pattern composed of a cross resistor pattern of a polycide layer formed on the field region; and
    a second pattern composed of polycide layer patterns and a silicide layer formed on an insulation layer over the active region,
    wherein the first pattern comprises:
        two polycide layer patterns having the same width formed to be orthogonal to each other;
        a first current contact pad and a first voltage contact pad each connectively formed at the lateral ends of one of the polycide layer patterns; and
        a second current contact pad and a second voltage contact pad each connectively formed at the lateral ends of the other polycide layer pattern, and wherein,
    the second pattern comprises:
        a pair of polycide layer patterns composed of a first polycide strip and a second polycide strip extended in parallel, being spaced from each other a predetermined interval on an insulating film formed on the active region;
        third and fourth current contact pads each connected to the lateral ends of the first polycide strip;
        third and fourth voltage contact pads connectively formed on the first polycide strip between the third and fourth current contact pads;

fifth and sixth current contact pads each connectively formed at the lateral ends of the second polycide strip;
fifth and sixth voltage contact pads connectively formed on the second polycide strip between the fifth current contact pad and the sixth current contact pad;
an active silicide strip formed over the active region between the first polycide strip and the second polycide strip;
seventh and eighth current contact pads each connectively formed at the ends of the active silicide strip; and
seventh and eighth voltage contact pads each connectively formed at the ends of the active silicide strip.

14. The test pattern of claim 13, wherein the first pattern is a test pattern for evaluating the sheet resistance of the polycide layer on the field region.

15. The test pattern of claim 13, wherein the second pattern is a pattern for indirectly evaluating a line width of the active silicide strip by measuring the line widths of the first polycide strip and second polycide strip of the second pattern by an electrical method.

16. The test pattern of claim 13, wherein the first current contact pad and the fifth current contact pad share the same pad, and the second current contact pad and the sixth current contact pad share the same pad.

* * * * *